United States Patent [19]

Davis

[11] Patent Number: 4,893,087
[45] Date of Patent: Jan. 9, 1990

[54] LOW VOLTAGE AND LOW POWER FREQUENCY SYNTHESIZER

[75] Inventor: Walter L. Davis, Coral Springs, Fla.

[73] Assignee: Motorola, Inc., Schaumburg, Ill.

[21] Appl. No.: 141,380

[22] Filed: Jan. 7, 1988

[51] Int. Cl.[4] .......................... H03B 19/00; H03L 7/00
[52] U.S. Cl. ...................................... 328/14; 328/155; 307/271; 331/1 A
[58] Field of Search ........................... 328/14, 15, 155; 307/271, 262; 331/1 A, 16, 17, 18

[56] References Cited

U.S. PATENT DOCUMENTS

| | | | |
|---|---|---|---|
| 4,305,045 | 12/1981 | Metz et al. | 331/1 A X |
| 4,330,758 | 5/1982 | Swisher et al. | 331/1 A |
| 4,453,136 | 6/1984 | Kelland | 331/18 X |
| 4,613,826 | 9/1986 | Masuko et al. | 331/17 X |
| 4,631,496 | 12/1986 | Borras et al. | 331/1 A |
| 4,635,000 | 1/1987 | Swanberg | 331/25 |

Primary Examiner—Stanley D. Miller
Assistant Examiner—Timothy P. Callahan
Attorney, Agent, or Firm—Michael J. DeLuca; Vincent B. Ingrassia

[57] ABSTRACT

A low power and low voltage frequency synthesizer includes a memory containing information to provide divisor information to the variable divider of a phase locked loop and information to select predetermined values of capacitance to connect to the frequency determining resonant network of the VCO to provide a coarse tuning. This tuning is then further modified by the normal operation of the phase locked loop.

4 Claims, 1 Drawing Sheet

LOW VOLTAGE AND LOW POWER FREQUENCY SYNTHESIZER

FIELD OF THE INVENTION

The field of the invention relates to frequency synthesizers for use in communication devices and more particularly, to frequency synthesizers which operate on very low voltages and reduced power.

BACKGROUND OF THE INVENTION

Frequency synthesizer phase locked loops have been utilized in communication transceivers for some period of time. The normal approach is to use a varactor tuned voltage controlled oscillator in combination with controlled modulus frequency divisors in the phase locked loop to produce the desired output frequency. In these prior art techniques, a varactor, or voltage controlled capacitor, is commonly used to vary the resonant frequency of the VCO tuning network in accordance with a control voltage. This approach requires the use of high varactor control voltages, typically, 12 volts or more, to achieve the VCO tuning range that is needed for feedback transceiver applications. In the case of small portable devices, especially single cell receivers, the voltage required and power consumed by this varactor tuning approach in a frequency synthesizer would consume excessive power and would result in a very shortened battery life.

The present invention is intended to overcome this disadvantage of the prior art by providing a channel frequency memory which provides not only the appropriate phase locked loop divisors for a PLL-VCO synthesizer but also alters the VCO frequency tuning network by selectively adding discrete capacitors to the frequency determining network of the VCO as a course frequency adjustment. Thus, only a low voltage, low varactor network with a much reduced tuning range is required to fine tune the VCO and allow the loop to operate properly.

SUMMARY OF THE INVENTION

It is an object of the invention to provide a low voltage, low powered frequency synthesizer which is capable of operating on at most a two cell battery.

It is a further object of the invention to provide a very low power frequency synthesizer utilizing a VCO that is tuned by a combination of additive capacitors and a low voltage varactor network to cover a broad range of frequencies.

It is yet a further object of the invention to provide a phase locked loop frequency synthesizer which does not require multi-cell batteries in conjunction with voltage multipliers to achieve reasonable tuning ranges.

DESCRIPTION OF THE PREFERRED EMBODIMENT

Figure 1:
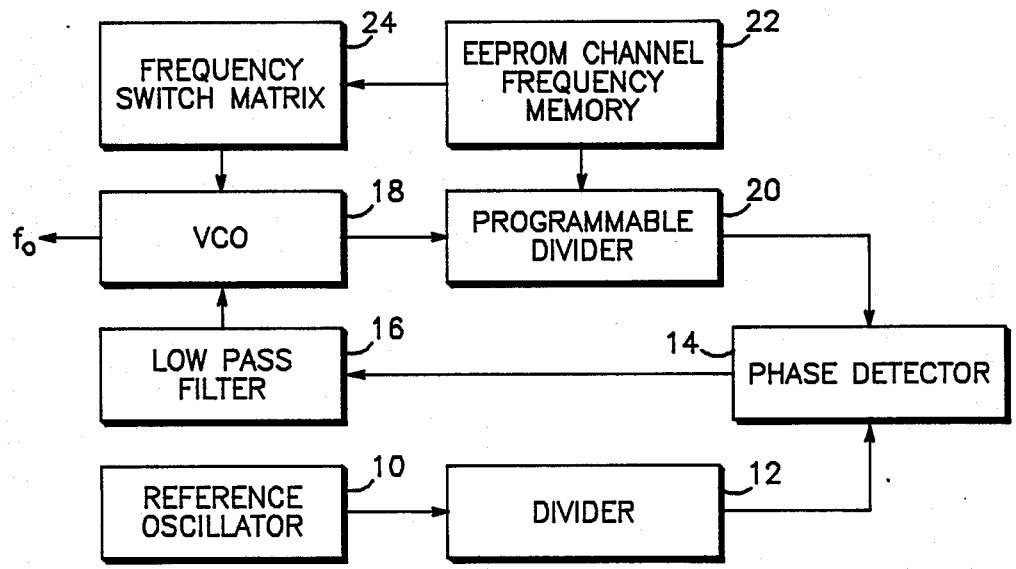
FIG. 1 shows a block diagram of a frequency synthesizer in employing the present invention.

FIG. 1 shows a phase locked loop frequency synthesizer, which includes many parts common with the frequency synthesizers of the prior art, but also includes additional devices as taught by the present invention. Reference oscillator 10 provides a fixed frequency reference signal to a divider 12. The divided down frequency from divider 12 is provided as a first input to phase detector 14 which provides a signal through a low pass filter 16 as a first input of VCO 18. One output of VCO 18 is connected through a programmable divider 20 and back to a second input to phase detector 14. A memory 22, for the preferred embodiment, an electrically erasable programmable read only memory containing channel frequency divisor information, modifies programmable divider 20 to adjust the division ratio of the two signals incoming to phase detector 14 so that the VCO produces an output of $F_0$ that is appropriate for the desired frequency synthesizer output. The operation of the elements as presently described, is well known in the art as a normal phase locked loop frequency synthesizer.

Channel frequency memory 22 not only includes division information supplied to the programmable divider 20 to adjust the output frequency, but it further includes information supplied to a frequency switch matrix 24 which adds discrete capacitors directly into the frequency determining resonant network of VCO 18. Thus, instead of requiring the high voltages and high current drains that are needed to drive the voltage controlled reactive elements used in prior art VCO tuning networks, fixed capacitance values can be selectively added to the frequency determining resonant network to provide the appropriate range of frequency outputs that are necessary to provide a broadband frequency synthesis. This is achieved while conserving the normal power that would be required to achieve that tuning.

Figure 2:
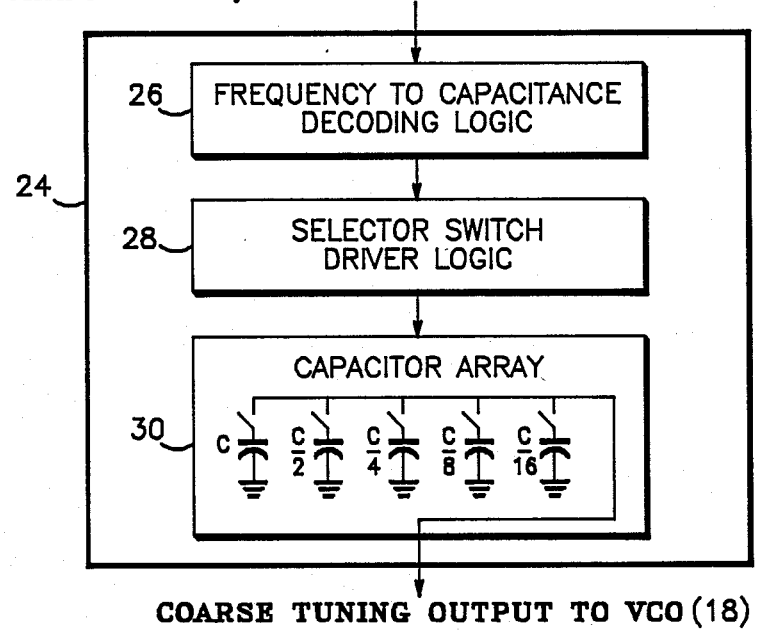
FIG. 2 is an additional detailed block diagram of a portion of the frequency synthesizer shown in FIG. 1.

FIG. 2 shows, in a more detailed manner, the structure of frequency matrix 24. The channel frequency data corresponding to the desired frequency and divisor information which is supplied to divider 20 from EEPROM memory 22 is supplied to a frequency to capacitance decoding logic block 26. This frequency to capacitance decoding logic supplies an output to selector switch driver logic 28 which selects various combinations of discrete capacitance from a capacitor array 30. These values are then added to the frequency determining resonant network of VCO 18. The output of capacitor array 30 may be one or any combination up to and including all of the capacitance. When added to the frequency determining circuit this achieves a course value of tuning for the frequency determining resonant circuit of VCO 18.

In operation, the frequency to capacitance decoding logic interprets from a predetermined value the appropriate capacitance which must be added to the VCO to enable the VCO to tune in a low power vernier manner to achieve the resultant frequency $F_0$. The selector switch driver logic responds to the frequency to capacitance decoding logic to merely select and latch which capacitors in the capacitor array 30 must be coupled into the circuit to achieve the course tuning.

Thus, it may be seen that for various frequencies, rather than tuning the VCO with a high voltage varactor network and correspondingly consuming the power required to maintain it and combining that with an appropriate divisor in programmable divider 20, the present low power frequency synthesizer augments the tuning capability of the VCO circuit as it is driven by an outside voltage source with discrete capacitor values to alter the tuning. The normal phase locked loop in combination with the altered coarse tuning provides the appropriate programmable frequency control ratio so that the synthesizer may provide the final output frequency F₀ in the appropriate range for desired operation. It will be clear to those skilled in the art that the switching in of the capacitor array requires considerably less power than the power required to drive the frequency determining resonant circuit of a VCO and maintain it at a fixed voltage and frequency output position for considerable lengths of time. Thus, it may be seen that the entire operation of the frequency synthesizer occurs with considerably less power consumed and may be operated with considerable lower voltages.

What is claimed is:

1. A low voltage and low power frequency synthesizer including a variable divider phase locked loop for controlling the output frequency of a voltage controlled oscillator (VCO) comprising:

memory means having information corresponding to a desired frequency and divisor information for the phase locked loop and the VCO; and frequency capacitance switch means coupled between said memory and said VCO responsive to additional information to select a predetermined value of capacitance, said switch means including a plurality of capacitors from which the frequency capacitance switch means may select, said switch means further including means producing a course tuning frequency determining network of the VCO whereby a broad range of frequencies can be synthesized at lower voltages and maintained with lower power consumption with the phase locked loop operating to maintain the precision of the desired frequency.

2. The frequency synthesizer of claim 1, wherein the memory means further comprises a programmable Read Only Memory (ROM).

3. The frequency synthesizer of claim 2, wherein said ROM is electrically erasable.

4. The frequency synthesizer of claim 1, wherein the plurality of capacitance includes at least five values in a binary related sequence.

* * * * *